US012580365B2

(12) United States Patent
An et al.

(10) Patent No.: US 12,580,365 B2
(45) Date of Patent: Mar. 17, 2026

(54) LASER DRIVER FOR DRIVING VCSEL

(71) Applicants: HYUNDAI MOTOR COMPANY, Seoul (KR); KIA CORPORATION, Seoul (KR); SOS LAB CO., LTD., Gwangju (KR)

(72) Inventors: Seon-Yong An, Chuncheon-si (KR); Kyoung-Chun Kweon, Hwaseong-si (KR); Hoon-Il Jeong, Gwangju-si (KR); Jun-Hwan Jang, Seongnam-si (KR); Chan-M Lim, Yongin-si (KR); Dong-Ju Jang, Bucheon-si (KR)

(73) Assignees: HYUNDAI MOTOR COMPANY, Seoul (KR); KIA CORPORATION, Seoul (KR); SOS LAB CO., LTD., Gwangju (KR)

( * ) Notice: Subject to any disclaimer, the term of this patent is extended or adjusted under 35 U.S.C. 154(b) by 896 days.

(21) Appl. No.: 17/826,451

(22) Filed: May 27, 2022

(65) Prior Publication Data

US 2023/0291176 A1     Sep. 14, 2023

(30) Foreign Application Priority Data

Mar. 10, 2022     (KR) ........................ 10-2022-0029986

(51) Int. Cl.
*H01S 5/042* (2006.01)
*H03K 17/687* (2006.01)

(52) U.S. Cl.
CPC ....... *H01S 5/0428* (2013.01); *H03K 17/6871* (2013.01); *H03K 2217/0063* (2013.01); *H03K 2217/0072* (2013.01)

(58) Field of Classification Search
CPC ........... H01S 5/18–187; H01S 5/0428; H03K 2217/0072; H03K 2217/0063
See application file for complete search history.

(56) References Cited

U.S. PATENT DOCUMENTS

| | | | | |
|---|---|---|---|---|
| 5,365,118 A | * | 11/1994 | Wilcox | H02M 7/538 |
| | | | | 327/390 |
| 5,770,967 A | * | 6/1998 | Alzati | H03K 17/063 |
| | | | | 327/365 |
| 6,272,160 B1 | | 8/2001 | Stronczer | |
| 9,054,485 B1 | | 6/2015 | Ng | |
| 11,240,894 B2 | * | 2/2022 | Oka | G01S 17/08 |

(Continued)

FOREIGN PATENT DOCUMENTS

| | | | | |
|---|---|---|---|---|
| CN | 107342756 A | * | 11/2017 | |
| CN | 110212405 A | * | 9/2019 | F41G 1/473 |

(Continued)

*Primary Examiner* — Joshua King

(74) *Attorney, Agent, or Firm* — MCDONNELL BOEHNEN HULBERT & BERGHOFF LLP

(57) ABSTRACT

A laser driver for driving a Vertical Cavity Surface Emitting Laser (VCSEL) includes a high-side switch (High-side Field Effect Transistor) having an internal capacitor for charging with a drain terminal thereof connected to a high-voltage terminal, a low-side switch (Low-side Field Effect Transistor) in which a drain terminal thereof is connected to a source terminal of the high-side switch and a source terminal thereof is connected to a ground terminal, and a VCSEL diode having an anode terminal connected to the high-side switch.

8 Claims, 9 Drawing Sheets

(56)                    References Cited

U.S. PATENT DOCUMENTS

| | | | | |
|---|---|---|---|---|
| 2002/0012151 A1* | 1/2002 | Feng | H04B 10/564 | 398/182 |
| 2007/0291807 A1* | 12/2007 | Uesaka | H01S 5/0683 | 372/38.04 |
| 2014/0028271 A1* | 1/2014 | Kondou | H02M 3/1588 | 323/271 |
| 2017/0324411 A1* | 11/2017 | Gong | H02M 3/07 | |
| 2018/0159529 A1* | 6/2018 | Reusch | H03K 17/08122 | |
| 2019/0238129 A1* | 8/2019 | Fukushima | H02M 1/08 | |
| 2020/0326425 A1* | 10/2020 | Donovan | G01S 7/486 | |
| 2020/0381989 A1* | 12/2020 | Kuang | H03K 19/01714 | |
| 2020/0393543 A1* | 12/2020 | David | G01S 7/4868 | |
| 2021/0098965 A1 | 4/2021 | Crawford et al. | | |
| 2021/0111533 A1* | 4/2021 | Mousavian | G01S 7/484 | |
| 2021/0111534 A1 | 4/2021 | Volk | | |
| 2021/0184576 A1* | 6/2021 | Cattani | H02M 1/08 | |
| 2021/0320649 A1* | 10/2021 | Wang | H03K 17/6871 | |
| 2022/0037853 A1* | 2/2022 | Oka | H01S 5/0428 | |
| 2022/0099726 A1* | 3/2022 | Lai | G01R 31/2856 | |

FOREIGN PATENT DOCUMENTS

| | | | | | |
|---|---|---|---|---|---|
| CN | 110635351 A | * | 12/2019 | | H01S 5/042 |
| CN | 107769530 B | * | 6/2020 | | |
| CN | 112731350 A | * | 4/2021 | | |
| CN | 113206589 A | * | 8/2021 | | G01S 7/484 |
| CN | 115102030 A | * | 9/2022 | | |
| DE | 102021123982 A1 | * | 3/2023 | | G01S 7/4815 |
| EP | 3872990 A1 | * | 9/2021 | | |
| JP | H07-202300 A | | 8/1995 | | |
| JP | 3607033 B2 | * | 1/2005 | | H03K 17/6871 |
| JP | 2005-347546 A | | 12/2005 | | |
| JP | 2019068528 A | * | 4/2019 | | |
| KR | 10-0207112 B1 | | 7/1999 | | |
| KR | 2013-0010678 A | | 1/2013 | | |
| KR | 10-1603566 B1 | | 3/2016 | | |

* cited by examiner (Prior Art)

<VCSEL applied voltage waveform>

<VCSEL laser output waveform>

<Change in charge of capacitor>

LASER DRIVER FOR DRIVING VCSEL

CROSS REFERENCE TO RELATED APPLICATIONS

This application claims priority to Korean Patent Application No. 10-2022-0029986, filed on Mar. 10, 2022, which is incorporated herein by reference in its entirety.

BACKGROUND

Field of the Disclosure

The present disclosure relates to a laser driver for driving a Vertical Cavity Surface Emitting Laser (VCSEL).

Particularly, the present disclosure relates to a laser driver for driving a large current having a pulse width of several nanoseconds for a range detection device using a laser, such as Light Detection and Ranging (LiDAR).

Description of Related Art

A laser driver is composed of a capacitor for charge and discharge, a switch such as an FET to turn on/off current, and a peripheral circuit for control.

The capacitor is selected in consideration of a pulse repetition rate, a current peak value, a pulse width, and the like. Inductors may be applied to respective paths to form a resonant loop for improving the charge/discharge rate of the capacitor or switching-on/off speed.

A conventional laser driver as illustrated in FIG. 1 usually uses individual capacitors C1, C2, C3, and C4 for respective channels to inject current into a diode through discharge. When the capacitors are configured for respective channels, the multiplicity of capacitors and additional parts for driving are used, so that the laser driver has a complex structure, an increased manufacturing cost, and a complicated assembly process. Therefore, increasing the number of channels according to the related art leads to an increase in the number of devices, thereby not only causing physical/cost constraints, but also complicating the implementation of driving logic and signaling for controlling the capacitors.

Similar to the application of a resonant structure for speed improvement, the complexity and cost increase of the structure/process are unavoidable for the implementation of multi-channel, and the control of the inductor-capacitor (LC) time constant, which determines the speed, becomes more complicated.

In addition, when the signal is on/off, the output capacitor of the switch inevitably repeats charge and discharge, and a current pulse is generated accordingly. That is, when a diode is operated, the discharge from the capacitor and the FET occurs at the same time. At this time, since each waveform arrives at the diode with a certain delay, there is a disadvantage in that the output waveform of the diode becomes longer.

Therefore, in the conventional technique, the current pulse is consumed as it is or is added to the current generated in the charge/discharge capacitor to generate a double laser pulse, thereby reducing the accuracy of range detection and measurement.

The contents described in Description of Related Art are to help the understanding of the background of the present disclosure, and may include what is not previously known to those skilled in the art to which the present disclosure pertains.

SUMMARY

The present disclosure has been devised to solve the above problems, and an objective of the present disclosure is to provide a laser driver for driving a Vertical Cavity Surface Emitting Laser (VCSEL), the laser driver being capable of improving speed without cost increase and structure change through minimizing signal line resistance and optimizing capacitance in FET without a separate capacitor configuration.

An aspect of the present disclosure provides a laser driver for driving a Vertical Cavity Surface Emitting Laser (VCSEL), the laser driver including a high-side switch (High-side Field Effect Transistor (H.FET)) having an internal capacitor for charging with a drain terminal thereof connected to a high-voltage terminal, a low-side switch (Low-side Field Effect Transistor (L.FET)) in which a drain terminal thereof is connected to a source terminal of the high-side switch and a source terminal thereof is connected to a ground terminal, and a VCSEL diode having an anode terminal connected to the high-side switch.

In an embodiment, a cathode terminal of the VCSEL diode may be connected to the ground terminal.

In an embodiment, the internal capacitor may have a capacitance of 200-300 pF.

In an embodiment, when the high-side switch is open and the low-side switch is closed, the internal capacitor may be charged by the voltage applied from the high-voltage terminal.

In an embodiment, when the high-side switch is closed and the low-side switch is open, the charge in the internal capacitor may be discharged through transfer toward the VCSEL diode.

In an embodiment, the laser driver may further include FET drivers to drive the high-side switch and the low-side switch, respectively.

In an embodiment, the laser driver may further include a ground resistor connected in parallel between the low-side switch and the VCSEL diode.

In an embodiment, the laser driver may include a plurality of channels each including the high-side switch, the low-side switch, and the VCSEL diode, wherein the drain terminals of the high-side switches in the plurality of channels are connected to each other.

In an embodiment, the laser driver may further include a resistor added to a charging path of the internal capacitor.

In an embodiment, the resistor may be located between the high-voltage terminal (HV) and the high-side switch (H.FET) or between the high-side switch (H.FET) and the low-side switch (L.FET) or between the low-side switch (L.FET) and the ground terminal.

In an embodiment, a cathode terminal of the VCSEL diode may be connected to the ground terminal.

In an embodiment, the internal capacitor may have a capacitance of 200-300 pF.

In an embodiment, when the high-side switch is open and the low-side switch is closed, the internal capacitor may be charged by the voltage applied from the high-voltage terminal.

In an embodiment, when the high-side switch is closed and the low-side switch is open, the charge in the internal capacitor may be discharged through transfer toward the VCSEL diode.

While the conventional driver structure is a circuit diagram with a conventional high-voltage multi-channel configuration in which a separate capacitor and a switch element are used, unlike the conventional structure, the present driver structure does not use a separate capacitor and optimizes the capacitance used in the FET, which is a switch element, so that the diode emits light by utilizing the capacitance applied to the FET without a capacitor. Therefore, it is possible to improve the speed without an increase in cost through device and wiring optimization, thereby improving the detection performance of the LiDAR.

DETAILED DESCRIPTION

In order to fully understand objectives, operations, and effects and advantages of the present disclosure, a reference should be made to the accompanying drawings illustrating preferred embodiments of the present disclosure and the contents described in the accompanying drawings.

In describing preferred embodiments of the present disclosure, a description about known techniques or a repetitive description that may unnecessarily obscure the gist of the present disclosure will be shortened or omitted.

Figure 1:
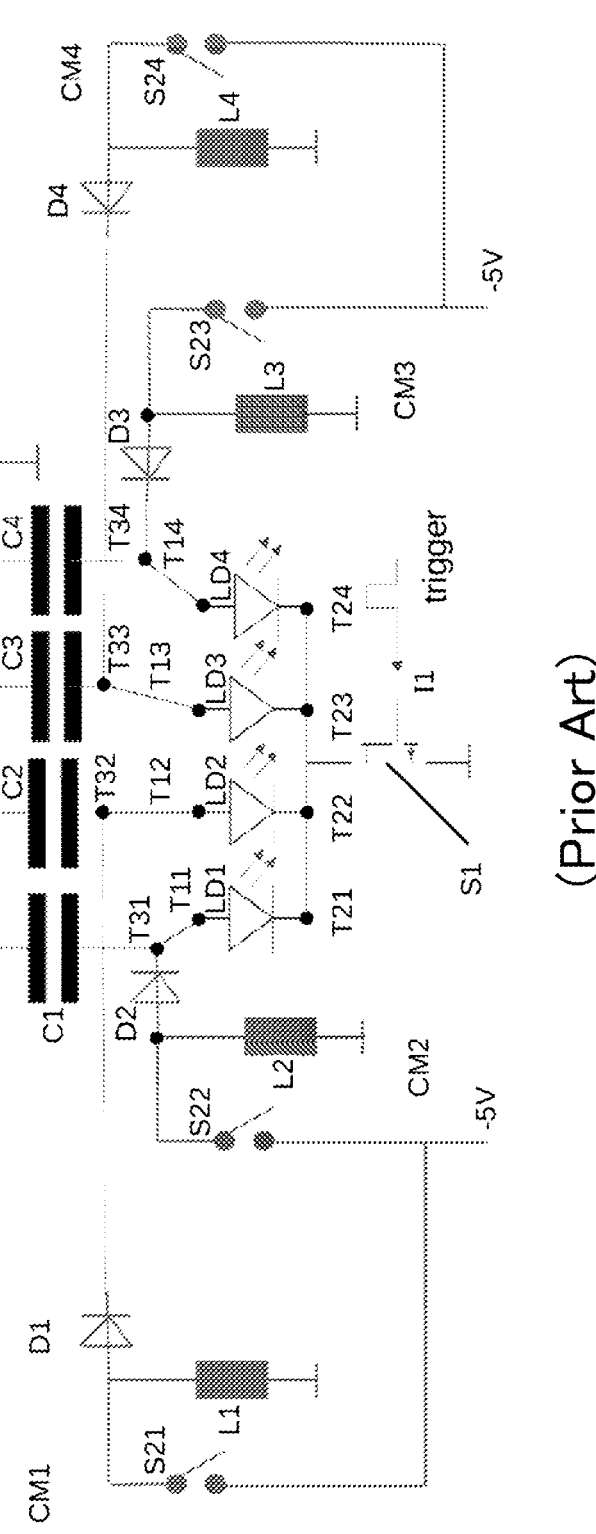
FIG. 1 illustrates a conventional laser driver.
Figure 2:
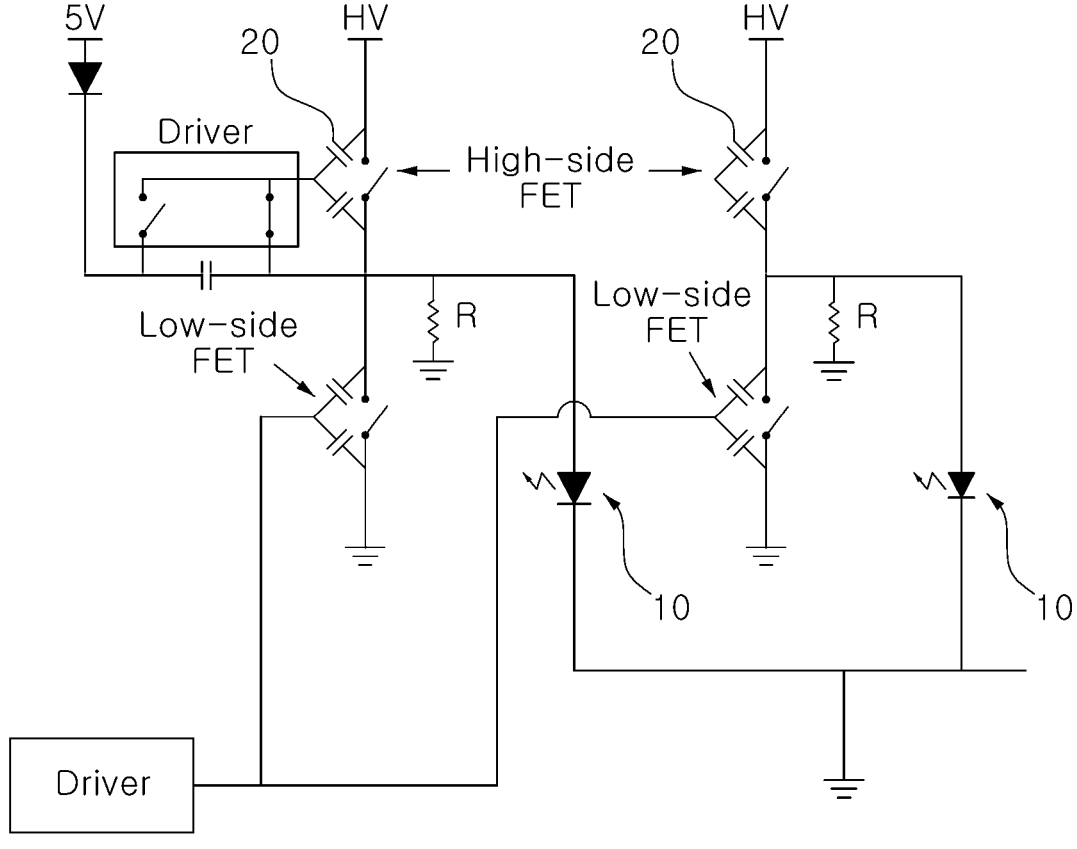
FIG. 2 schematically illustrates a laser driver for driving a Vertical Cavity Surface Emitting Laser (VCSEL) according to an embodiment of the present disclosure.
Figure 3:
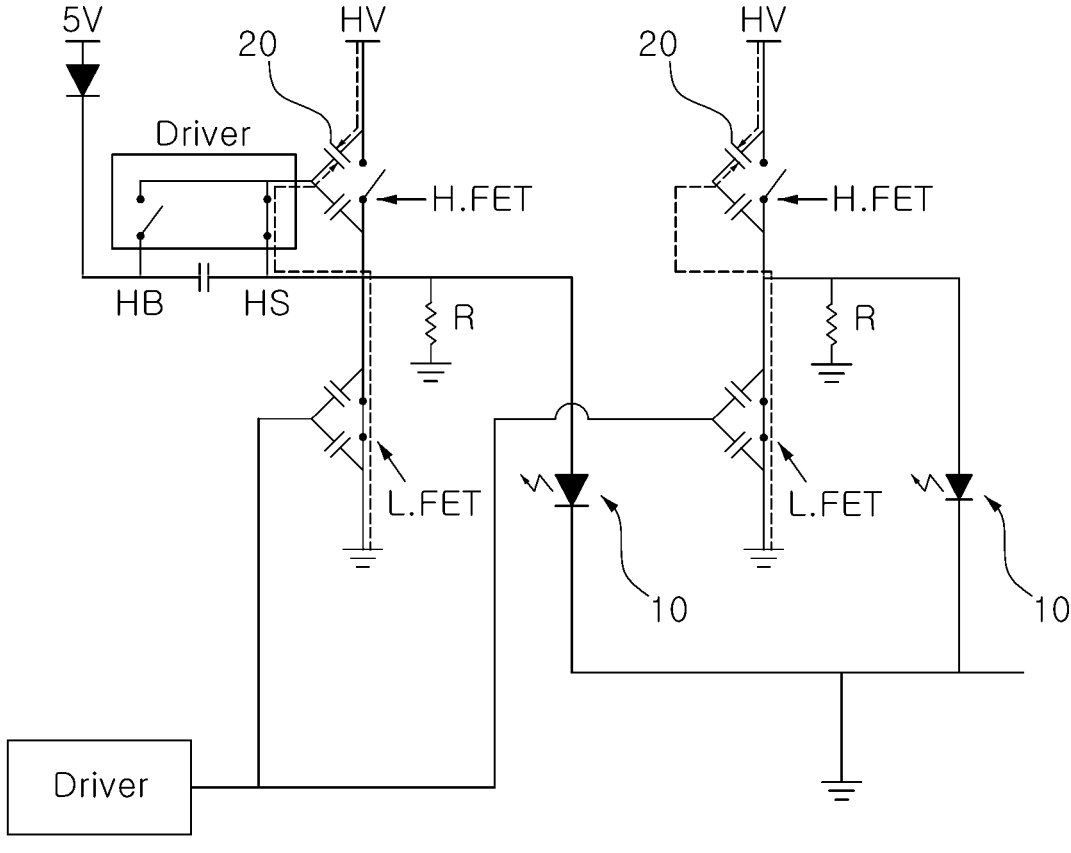
FIGS. 3 and 4 illustrate an operation state of the laser driver for driving a VCSEL according to the embodiment of the present disclosure.
Figure 4:
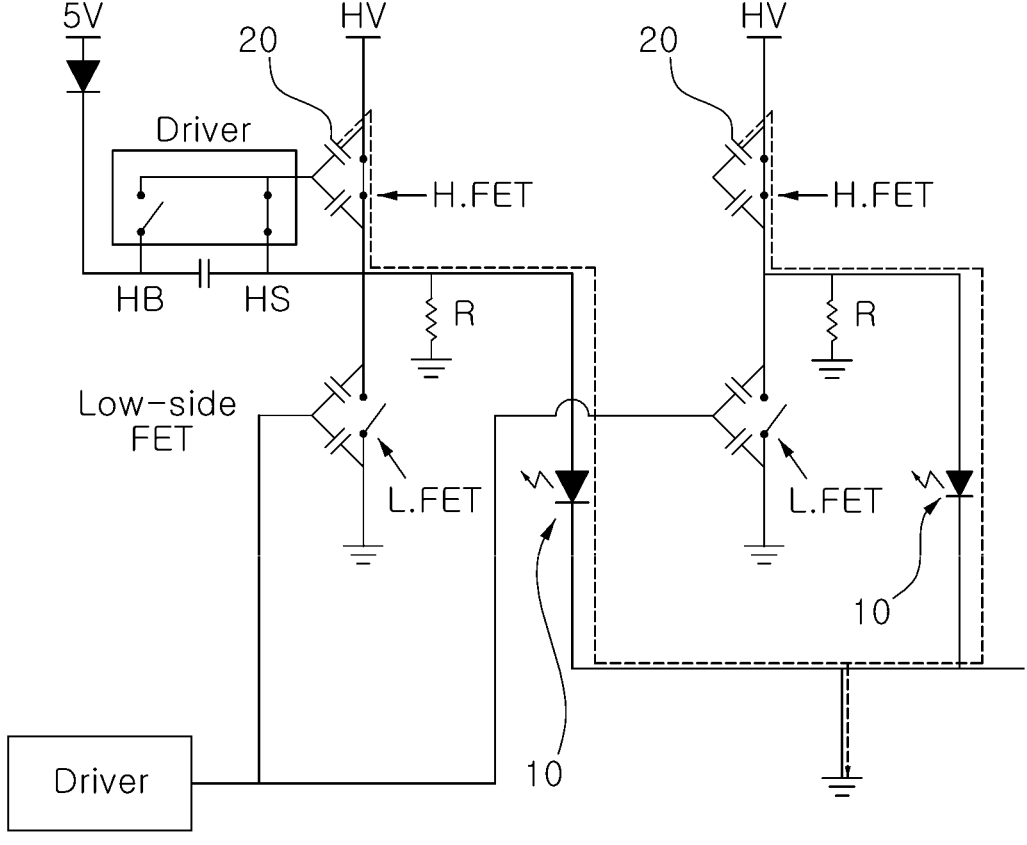

FIG. 2 schematically illustrates a laser driver for driving a Vertical Cavity Surface Emitting Laser (VCSEL) according to an embodiment of the present disclosure, and FIGS. 3 and 4 illustrate an operation state of the laser driver for driving a VCSEL according to the embodiment of the present disclosure.

Hereinafter, a laser driver for driving a VCSEL according to an embodiment of the present disclosure will be described with reference to FIGS. 2 to 4.

Unlike the conventional structure that requires individual charging/discharging capacitors for respective channels, the laser driver for driving a VCSEL according to the present disclosure has a structure that can omit the charging capacitor, and utilizes an output capacitor of a high-side switch for charging and discharging. Thus, this structure is a structure that can be integrated and reduced in cost by minimizing the number of parts required to configure a multi-channel VCSEL driver.

For this purpose, the laser driver for driving a VCSEL according to the present disclosure may be configured in multiple channels (only two channels are illustrated in FIG. 2) each including a high-side switch (High-side FET or H.FET), a low-side switch (Low-side FET or L.FET), and a VCSEL diode 10. In the case of a multi-channel configuration, drain terminals of the high-side switches H.FETs in the respective channels are connected to each other.

In addition, the laser driver includes a driver (FET drive) for driving the high-side switch (High-side FET) and the low-side switch (Low-side FET), and a ground resistor R.

Each of the high-side switch H.FET and the low-side switch L.FET may be a field effect transistor (FET) driven on/off by the FET driver, and includes an internal capacitor 20 (output-capacitor).

The high-side switch H.FET functions as a switch for discharging the internal charging capacitor 20 toward the VCSEL diode 10, wherein a drain terminal thereof is connected to a high-voltage terminal HV, and a source terminal thereof is connected to a drain terminal of the low-side switch L.FET and an anode terminal of the VCSEL diode 10.

In particular, the internal capacitor 20 preferably has a capacitance of 200 to 300 pF.

The low-side switch L.FET functions as a switch for normally driving the high-side switch H.FET, wherein a drain terminal thereof is connected to a source terminal of the high-side switch H.FET, and a source terminal thereof is connected to the ground.

The VCSEL diode 10 converts an applied electrical signal into an optical signal to output a laser, wherein an anode terminal thereof is connected to the high-side switch (H.FET), and a cathode terminal thereof is connected to a ground terminal.

In addition, a ground resistor R is connected in parallel between the low-side switch L.FET and the VCSEL diode 10, and is connected to the ground.

In the VCSEL driving laser diode configured in this way, as illustrated by dotted line in FIGS. 3 and 4, when the high-side switch H.FET is open (off) and the low-side switch L.FET is closed (on), the internal capacitor (20, output-capacitor) of the high-side switch H.FET is charged.

In addition, when the high-side switch H.FET is closed (on) and the low-side switch L.FET is open (off), the charge in the internal capacitor 20 (output-capacitor) of the high-side switch H.FET is discharged along a path through the high-side switch H.FET→the anode terminal of the VCSEL diode 10→the cathode terminal of the VCSEL diode 10→the ground terminal, and at this time, laser power is output from the VCSEL.

Figure 5:
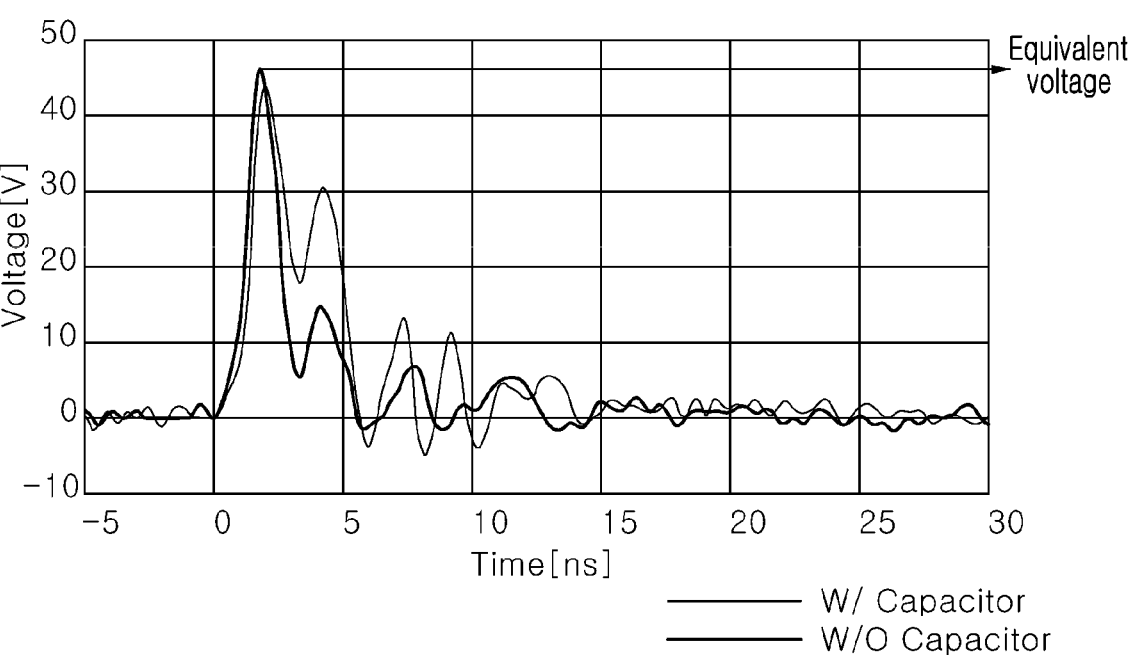
FIGS. 5 and 6 illustrate the comparison of the effects of the laser driver for driving a VCSEL according to the embodiment of the present disclosure.
Figure 6:
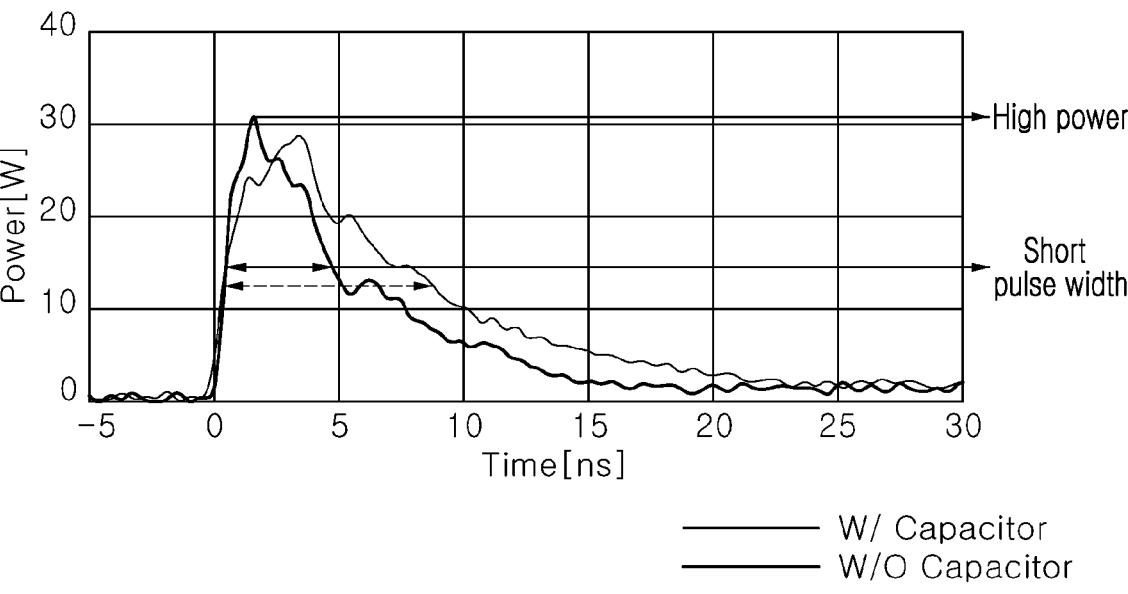

FIGS. 5 and 6 illustrate the comparison of the effects of the laser driver for driving a VCSEL according to the embodiment of the present disclosure.

Referring to this, it can be seen that the present disclosure has superior laser output and waveform compared to those of the conventional structure when having an equivalent voltage (high power, narrow pulse width).

In the VCSEL applied voltage waveform graph, the first main peak has an equivalent voltage. At this time, in the conventional structure, the main peak is obtained by a capacitor, and the remaining peak, which is the second peak, is obtained by a switch.

In the structure of the present disclosure, the main peak is a peak obtained by an FET switch, and the second peak is a remaining peak obtained by other element (e.g., resistor, diode, etc.).

It can be seen that the size of the remaining peaks occurring later is larger in the conventional structure. This results in unnecessary laser output, which only increases power consumption.

In addition, when comparing the laser output waveforms, the structure of the present disclosure has higher output and narrower pulse width compared to those of the conventional structure.

The effect of the present disclosure is that when the present disclosure is applied to an actual LIDAR, the high output can increase a detection range of the LIDAR.

In addition, since the narrow pulse width increases the light emission speed of a laser, it is possible to increase the detection speed of a LIDAR and increase the accuracy thereof.

Figure 7:
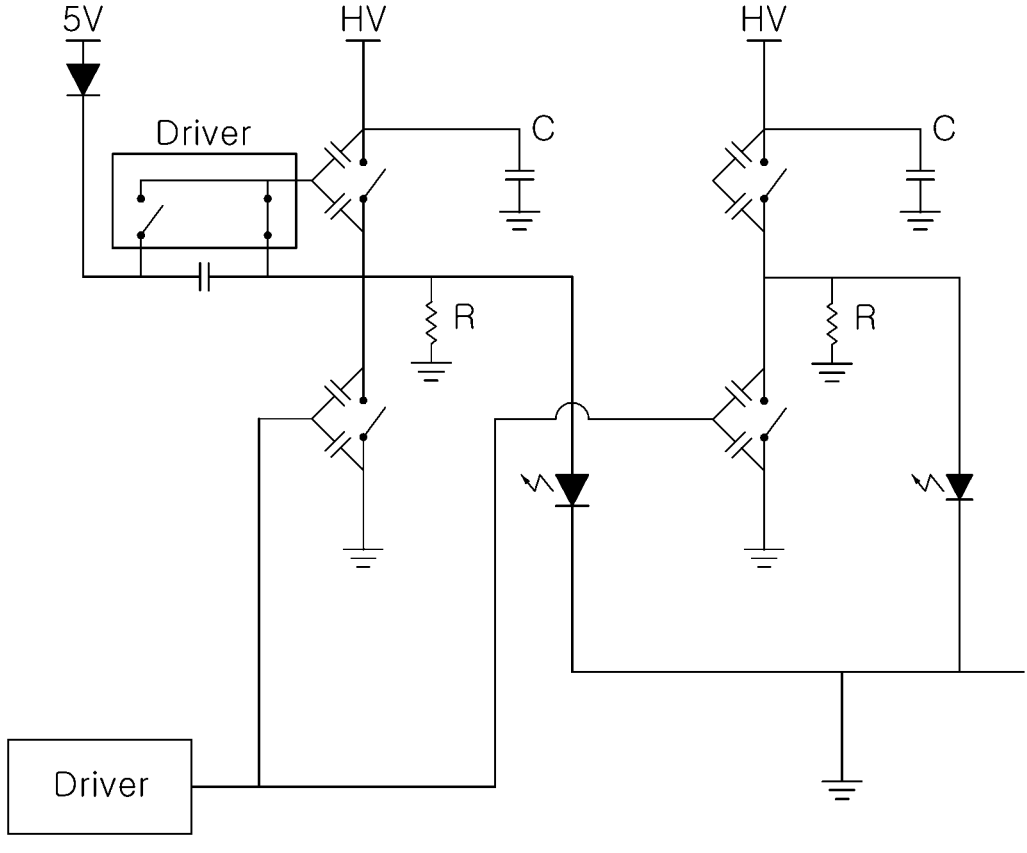
FIG. 7 schematically illustrates a conventional laser driver for comparison with the present disclosure.

Next, FIG. 7 schematically illustrates a conventional laser driver for comparison with the present disclosure. That is, FIG. 7 schematically illustrates a circuit diagram of a conventional high-voltage multi-channel to which a separate capacitor C is added for each channel, and an FET is applied.

The present disclosure provides a structure for emitting light from a diode without a capacitor by removing a separate capacitor from the existing structure and optimizing the capacitance used in an FET. For example, while the existing circuit may employ a capacitor having a charge of 300 pF and an FET of 110 pF, in the present disclosure, a separate capacitor may be removed, an FET device having a capacitance of 200-300 pF corresponding to a conventionally required capacitance may be applied, and the FET device may be optimized to have a capacitance of 260 pF.

Figure 8:
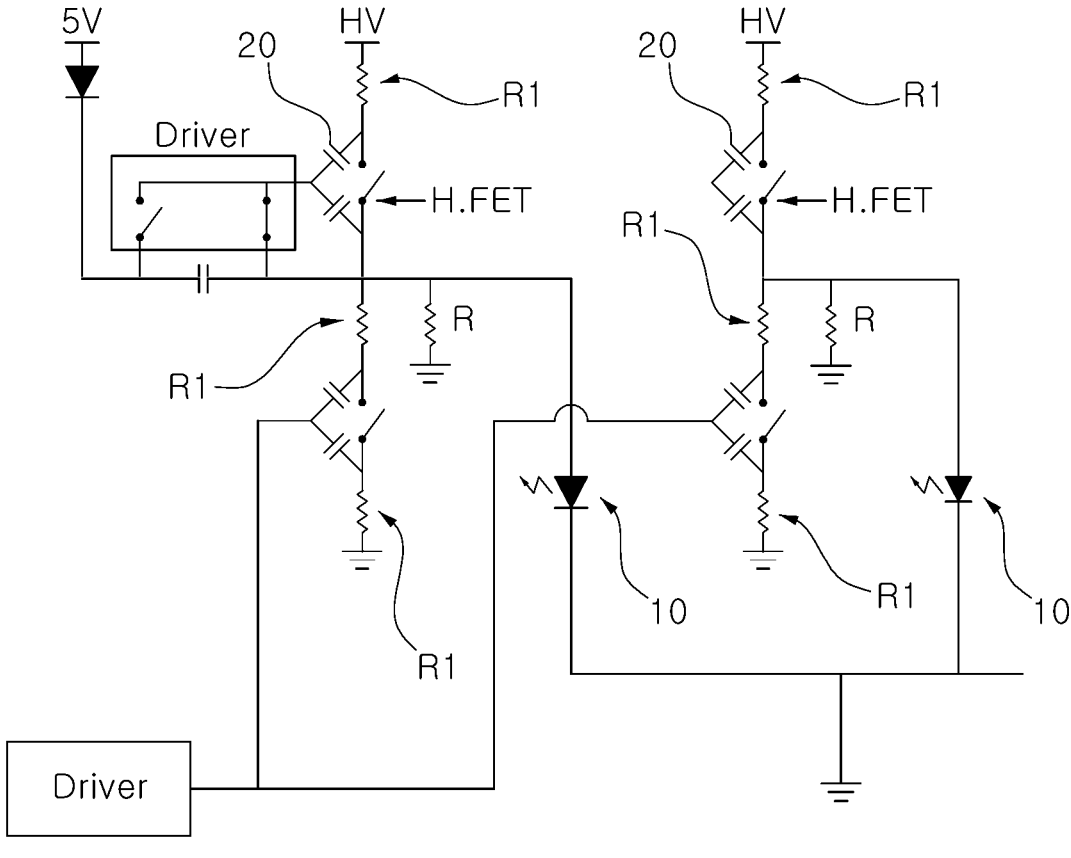
FIG. 8 illustrates an exemplary application of the laser driver for driving a VCSEL according to the embodiment of the present disclosure.
Figure 9:
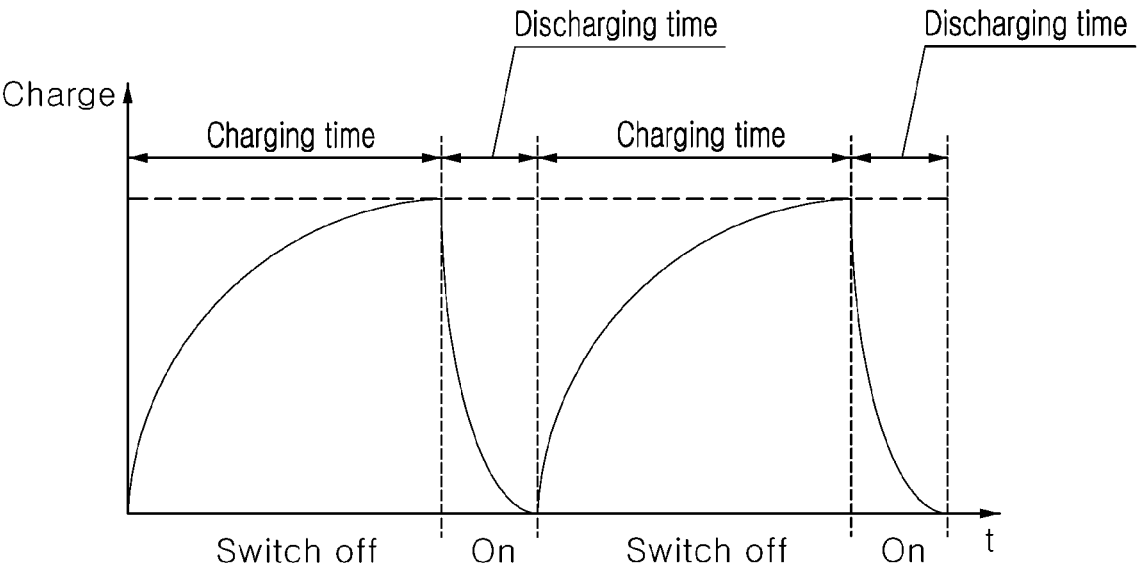
FIG. 9 illustrates a change in the amount of electric charge of a capacitor according to driving of the laser driver.

Next, FIG. 8 illustrates an exemplary application of the laser driver for driving a VCSEL according to the embodiment of the present disclosure, and FIG. 9 illustrates a change in the amount of electric charge of a capacitor according to driving of the laser driver.

The laser driver for driving a VCSEL according to the exemplary application has a structure in which a separate resistor R1 is added.

At this time, the resistor is not limited in size or number, but any number of resistors may be additionally located between the high-voltage terminal HV and the high-side switch H.FET, between the high-side switch H.FET and the low-side switch L. FET, and between the low-side switch L.FET and the ground terminal.

When a resistor is added in this way, the charging time becomes longer depending on a resistance value, which allows the laser emission interval to be adjusted.

In the laser driver, the capacitor basically repeats charging and discharging, and at the time of discharging, current flows through the laser, which in turn emits light.

As illustrated in FIG. 9, the charge in the capacitor varies with time, and the charging and discharging times are proportional to the resistance value on paths through which respective current flows×capacitance. While the same capacitor exists in the charging path and the discharging path, a resistor exists on the charging path but not on the discharging path (only a very weak wire resistance exists), so the charging time is long and the discharging time is short.

This can result in very short laser pulses. The direct current flow by HV during discharge is suppressed by the resistor present at a charging terminal (most of the HV is applied to the resistor, not the laser), making it possible to operate the laser only with the discharge current by the capacitor.

As described above, the present disclosure selects a switch having an output capacitance similar to a conventionally used charge/discharge capacitance to utilize electrical/optical energy that was previously discarded, through active control, thereby improving energy efficiency. Therefore, the present disclosure has an equivalent voltage and superior laser output and pulse width compared to the conventional technique. When applied to a LIDAR module, the present disclosure may increase a detection range as well as the sensing accuracy.

While the present disclosure as described above has been illustrated with reference to the drawings, the present disclosure is not limited to the described embodiments, and it is obvious to those of ordinary skill in the art that various modifications and variations can be made without departing from the spirit and scope of the present disclosure. Therefore, such modifications or variations should be considered to belong to the claims of the present invention, and the scope of the present invention should be construed on the basis of on the appended claims.

The invention claimed is:

1. A laser driver for driving a Vertical Cavity Surface Emitting Laser (VCSEL), the laser driver comprising:
   a high-side switch with a drain terminal thereof connected to a high-voltage terminal;
   a low-side switch having a drain terminal connected to a source terminal of the high-side switch, and having a source terminal connected to a ground terminal; and
   a VCSEL diode having an anode terminal connected to the high-side switch;
   wherein the high-side switch includes a capacitor for charging;
   wherein the low-side switch and the VCSEL diode are connected in parallel;
   further comprising a resistor added to a charging path of the capacitor;
   wherein the resistor is located between the high-side switch and the low-side switch or between the low-side switch and the ground terminal.

2. The laser driver for driving a VCSEL according to claim 1, wherein a cathode terminal of the VCSEL diode is connected to the ground terminal.

3. The laser driver for driving a VCSEL according to claim 1, wherein the capacitor has a capacitance of 200-300 pF.

4. The laser driver for driving a VCSEL according to claim 1, wherein when the high-side switch is open and the low-side switch is closed, the capacitor is charged by the voltage applied from the high-voltage terminal.

5. The laser driver for driving a VCSEL according to claim 4, wherein when the high-side switch is closed and the low-side switch is open, the charge in the capacitor is discharged through transfer toward the VCSEL diode.

6. The laser driver for driving a VCSEL according to claim 5, further comprising a first driver to drive the high-side switch and a second driver to drive the low-side switch.

7. The laser driver for driving a VCSEL according to claim 1, further comprising a ground resistor connected in parallel between the low-side switch and the VCSEL diode.

8. The laser driver for driving a VCSEL according to claim 1, wherein the laser driver comprises a plurality of channels each including the high-side switch, the low-side switch, and the VCSEL diode, wherein the drain terminals of the high-side switches in the plurality of channels are connected to each other.

* * * * *